(12) United States Patent
Lee

(10) Patent No.: US 9,368,195 B2
(45) Date of Patent: Jun. 14, 2016

(54) MEMORY SYSTEM FOR PROCESSING DATA FROM MEMORY DEVICE, AND METHOD OF OPERATING THE SAME

(71) Applicant: SK hynix Inc., Gyeonggi-do (KR)

(72) Inventor: Jong-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/678,555

(22) Filed: Apr. 3, 2015

(65) Prior Publication Data

US 2016/0141026 A1   May 19, 2016

(30) Foreign Application Priority Data

Nov. 17, 2014  (KR) .................... 10-2014-0159954

(51) Int. Cl.
*G11C 16/04* (2006.01)
*G11C 11/56* (2006.01)
*G11C 16/10* (2006.01)
*G11C 16/26* (2006.01)

(52) U.S. Cl.
CPC ........ *G11C 11/5642* (2013.01); *G11C 11/5628* (2013.01); *G11C 16/10* (2013.01); *G11C 16/26* (2013.01)

(58) Field of Classification Search
CPC .............. G11C 16/10; G11C 13/0033; G11C 13/0007; G11C 13/0069; G11C 16/3431; G11C 2213/71
USPC ............. 365/185.03, 185.08, 185.09, 185.25, 365/230.03, 230.06
See application file for complete search history.

(56) References Cited

U.S. PATENT DOCUMENTS

| 5,603,001 A * | 2/1997 | Sukegawa ............. G06F 3/0601 711/103 |
| 8,407,405 B2 * | 3/2013 | Otsuka ................ G06F 12/0246 711/103 |
| 8,438,361 B2 | 5/2013 | Goss et al. |
| 8,730,721 B2 | 5/2014 | Camp et al. |
| 8,898,543 B2 * | 11/2014 | Jo ........................ G06F 11/1072 714/721 |
| 2006/0171200 A1* | 8/2006 | Rinerson ............. G06F 17/5045 365/185.1 |
| 2010/0195393 A1* | 8/2010 | Eggleston ............. G06F 11/106 365/185.09 |
| 2014/0325294 A1* | 10/2014 | Chan ..................... G06F 11/076 714/708 |

FOREIGN PATENT DOCUMENTS

| KR | 1020080030756 | 4/2008 |
| KR | 1020110109418 | 10/2011 |
| KR | 1020130022604 | 3/2013 |
| KR | 1020130142965 | 12/2013 |

* cited by examiner

*Primary Examiner* — Gene Auduong
(74) *Attorney, Agent, or Firm* — IP & T Group LLP

(57) ABSTRACT

A memory system includes a memory device including memory blocks, each of the memory blocks including pages, each of the pages including memory cells that are electrically coupled to word lines, wherein the memory cells store data that is requested from a host; and a controller suitable for reading first data corresponding to a read command received from the host, from a page of a first memory block among the memory blocks, storing the first data in a buffer, providing the first data stored in the buffer, to the host, and writing and storing the first data stored in the buffer, in a page of a second memory block among the memory blocks.

16 Claims, 12 Drawing Sheets

FIG. 12
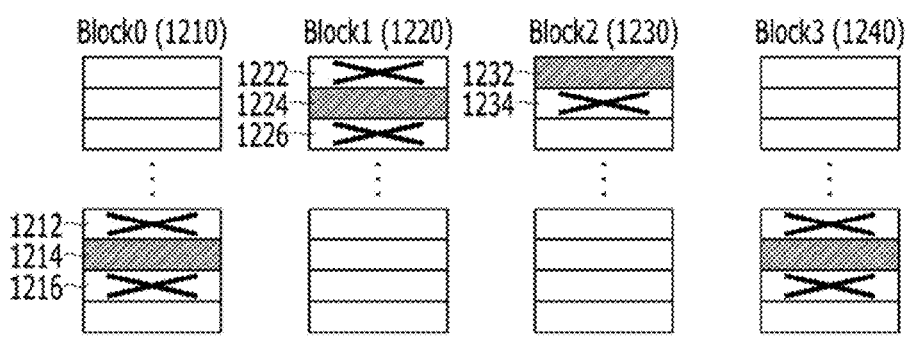
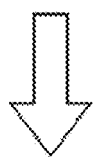
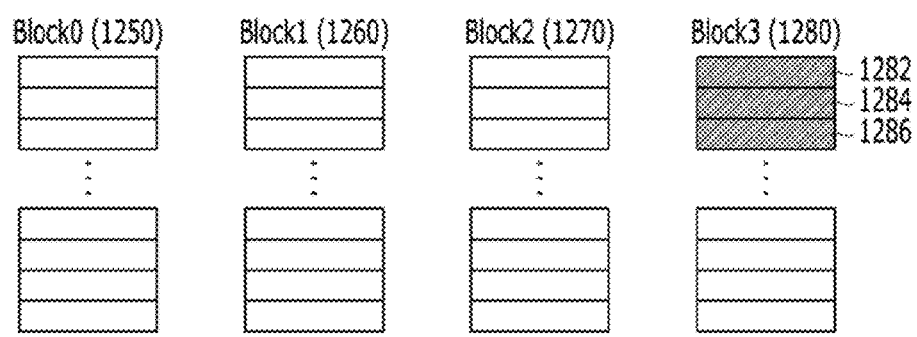

MEMORY SYSTEM FOR PROCESSING DATA FROM MEMORY DEVICE, AND METHOD OF OPERATING THE SAME

CROSS-REFERENCE TO RELATED APPLICATIONS

The present application claims priority of Korean Patent Application No. 10-2014-0159954, filed on Nov. 17, 2014, which is incorporated herein by reference in its entirety.

BACKGROUND

1. Field

Exemplary embodiments of the present invention relate to a memory system and, more particularly, to a memory system which processes data from a memory device, and a method of operating the same.

2. Description of the Related Art

Recently, the paradigm for the computing environment has changed to ubiquitous computing, so that computer systems can be used anytime and anywhere. Because of this, the use of portable electronic devices such as mobile phones, digital cameras, and notebook computers has rapidly increased. Such portable electronic devices generally use memory systems with memory devices, that is, data storage devices. Data storage devices are used as main memory or auxiliary memory devices within the portable electronic devices.

Data storage devices with memory devices are advantageous because, since there are no moving parts, stability and durability is excellent, information access speed is high, and power consumption is low. Examples of data storage devices having memory systems with these advantages include universal serial bus (USB) memory devices, memory cards having various interfaces, and solid state drives (SSD).

SUMMARY

Various embodiments are directed to a memory system and a method of operating the same that are capable of quickly and stably processing data from a memory device.

In an embodiment, a memory system may include: a memory device including memory blocks, each of the memory blocks including pages, each of the pages including memory cells that are electrically coupled to word lines, wherein the memory cells store data that is requested from a host; and a controller suitable for reading first data corresponding to a read command received from the host, from a page of a first memory block among the memory blocks, storing the first data in a buffer, providing the first data stored in the buffer to the host, and writing and storing the first data that is stored in the buffer to a page of a second memory block among the memory blocks.

The first data may be data which is identified as hot data.

The hot data may be identified in response to at least one of a read count, a read frequency and a priority of data that is requested from the host.

The priority may be determined in response to at least one of an importance of data that is requested from the host, a size of data and a latency of data.

Information on the priority may be included in the read command received from the host.

Information indicating that the first data may be the hot data is included in the read command received from the host.

The first memory block may be a multi-level cell (MLC) memory block, and the second memory block may be a single level cell (SLC) memory block.

When a read command for the first data stored in the page of the second memory block is received from the host, the controller may read the first data from the page of the second memory block, may store the first data in the buffer, and may provide the first data to the host.

The controller may update data storage information indicating that the first data is stored in the page of the first memory block, with information indicating that the first data is stored in the page of the second memory block.

In an embodiment, a method for operating a memory system may include: receiving a read command from a host; checking data storage information on first data corresponding to the read command, and reading the first data from a page of a first memory block, among a plurality of memory blocks which include a plurality of pages, based on the data storage information; storing the first data in a buffer; providing the first data, which is stored in the buffer, to the host; and writing and storing the first data stored in the buffer, in a page of a second memory block among the memory blocks.

The first data may be data which is identified as hot data.

The hot data may be identified in response to at least one of a read count, a read frequency, and a priority of data that is requested from the host.

The priority may be determined in response to at least one of an importance of data that is requested from the host, a size of data and a latency of data.

Information on the priority may be included in the read command, in the form of a context.

Information indicating that the first data may be the hot data is included in the read command.

The first memory block may be a multi-level cell (MLC) memory block, and the second memory block may be a single level cell (SLC) memory block.

The method may further include updating the data storage information indicating that the first data is stored in the page of the first memory block, with information indicating that the first data is stored in the page of the second memory block.

The method may further include receiving a read command for the first data stored in the page of the second memory block, from the host; and reading the first data from the page of the second memory block, based on the updated data storage information.

BRIEF DESCRIPTION OF THE DRAWINGS

FIGS. 12 and 13 are diagrams explaining a data processing operation with respect to a memory device in the memory system in accordance with an embodiment.

DETAILED DESCRIPTION

Figure 1:
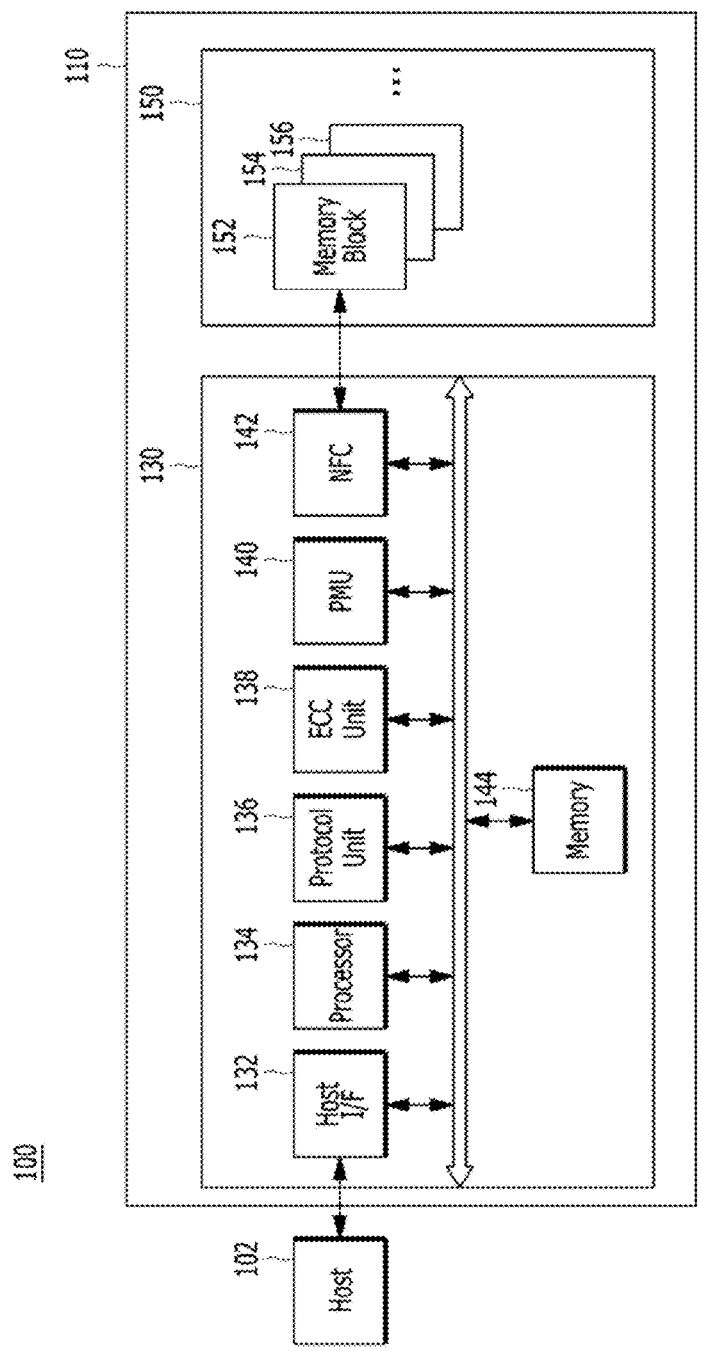
FIG. 1 is a diagram illustrating a data processing system including a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure be thorough and complete, and will fully convey the scope of the present invention to those skilled in the art. Throughout the disclosure, like reference numerals refer to like parts throughout the various figures and embodiments of the present invention.

FIG. 1 is a diagram illustrating a data processing system including a memory system in accordance with an embodiment of the present invention.

Referring to FIG. 1, the data processing system 100 may include a host 102 and a memory system 110.

The host 102 includes, for example, a portable electronic device such as a mobile phone, an MP3 player and a laptop computer or an electronic device such as a desktop computer, a game player, a TV and a projector.

The memory system 110 operates in response to a request from the host 102, and in particular, stores data to be accessed by the host 102. In other words, the memory system 110 may be used as a main memory device or an auxiliary memory device of the host 102. The memory system 110 may be implemented with any one of various kinds of storage devices, according to the protocol of a host interface to be electrically coupled with the host 102. For example, the memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices which realize the memory system 110 may be implemented with a volatile memory device such as a dynamic random access memory (DRAM) and a static random access memory (SRAM), or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM) a phase change RAM (PRAM), a magnetic RAM (MRAM) and a resistive RAM (RRAM).

The memory system 110 includes a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as an SSD, the operation speed of the host 102, which is electrically coupled with the memory system 110 may be significantly increased.

The controller 130 and the memory device 150 may be integrated into one semiconductor device and configure a memory card. For example, the controller 130 and the memory card 150 may be integrated into one semiconductor device and configure a memory card such as a Personal Computer Memory Card International Association (PCMCIA) card, a compact flash (CF) card, a smart media (SM) card, a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 includes a plurality of memory blocks 152, 154 and 156. Each of the memory blocks 152, 154 and 156 includes a plurality of pages. Each of the pages includes a plurality of memory cells to which a plurality of word lines (WL) are electrically coupled. The memory device 150 may be a nonvolatile memory device, for example, a flash memory. The flash memory may have a three-dimensional (3D) stack structure. Since the structure of the memory device 150 and the three-dimensional (3D) stack structure of the memory device 150 will be described later in detail with reference to FIGS. 2 to 11, detailed descriptions thereof will be omitted for now.

The controller 130 of the memory system 110 controls the memory device 150 in response to a request from the host 102. For example, the controller 130 provides the data read from the memory device 150, to the host 102, and stores the data provided from the host 102, in the memory device 150. To this end, the controller 130 controls overall operations of the memory device 150, such as read, write, program and erase operations.

In detail, the controller 130 includes a host interface unit 132, a processor 134, a protocol unit 136, an error correction code (ECC) unit 138, a power management unit 140, a NAND flash controller 142, and a memory 144.

The host interface unit 132 processes commands and data provided from the host 102, and may be configured to communicate with the host 102 through at least one of various interface protocols such as a universal serial bus (USB), a multimedia card (MMC), a peripheral component interconnect-express (PCI-E), a serial-attached SCSI (SAS), a serial advanced technology attachment (SATA), a parallel advanced technology attachment (DATA), a small computer system interface (SCSI), an enhanced small disk interface (ESDI), and an integrated drive electronics (IDE).

The ECC unit 138 detects and corrects an error included in the data read from the memory device 150 during the read operation. That is, after performing an error correction decoding operation on the data read from the memory device 150, the ECC unit 138 may determine whether the error correction decoding operation has succeeded, output an indication signal in response to a determination result, and correct an error bit of the read data based on a parity bit generated by an ECC encoding process. The ECC unit 138 may not correct error bits if the number of the error bits is equal to or greater than a threshold number of correctable error bits, and may output an error correction fail signal indicating that it is incapable of correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The protocol unit 135 stores and manages protocols for the controller 130 to control the memory device 150 in response to a request from the host 102. The PMU 140 provides and manages power for the controller 130, that is, power for the component elements included in the controller 130.

The NEC 142 serves as a memory interface between the controller 130 and the memory device 150 to allow the controller 130 to control the memory device 150 in response to a request from the host 102. The NEC 142 generates control signals for the memory device 150 and processes data under the control of the processor 134, when the memory device 150 is a flash memory and, in particular, when the memory device 150 is a NAND flash memory.

The memory 144 serves as a working memory of the memory system 110 and the controller 130, and stores data for driving the memory system 110 and the controller 130. In detail, when the controller 130 controls the memory device 150 in response to a request from the host 102, for example, when the controller 130 provides the data read from the memory device 150 to the host 102, and stores the data provided from the host 102 in the memory device 150, and, to this end, when the controller 130 controls the operations of the memory device 150, such as read, write, program and erase operations, the memory 144 stores data needed to allow such operations to be performed by the memory system 110, that is, between the controller 130 and the memory device 150.

The memory 144 may be implemented with volatile memory. For example, the memory 144 may be implemented with a static random access memory (SRAM) or a dynamic random access memory (DRAM). As described above, the memory 144 stores data needed to perform the read and write operations between the host 102 and the memory device 150. To store the data, the memory 144 includes a program memory, a data memory, a write buffer, a read buffer, a map buffer, and so forth.

The processor 134 controls general operations of the memory system 110, and controls a write operation or a read operation for the memory device 150, in response to a write request or a read request from the host 102. The processor 134 drives firmware which is referred to as a flash translation layer (FTL), to control the general operations of the memory system 110. The processor 134 may be implemented with a microprocessor or a central processing unit (CPU).

A management unit (not shown) for performing "bad management," for example, bad block management, of the memory device 150 is included in the processor 134. The management unit checks the plurality of memory blocks included in the memory device 150, finds those that are bad (are in unsatisfactory condition for further use) and performs bad block management. When the memory device 150 is a flash memory, for example, a NAND flash memory, a program fail may occur during the write operation, for example, during the program operation, due to characteristics of a NAND logic function. "Bad management," that is, bad block management means processing memory blocks in which a program failure has occurred, as bad, and program the data that has failed to be programmed in a new memory block. Hereinbelow, the memory device in the memory system in accordance with an embodiment will be described in detail with reference to FIGS. 2 to 11.

Figure 2:
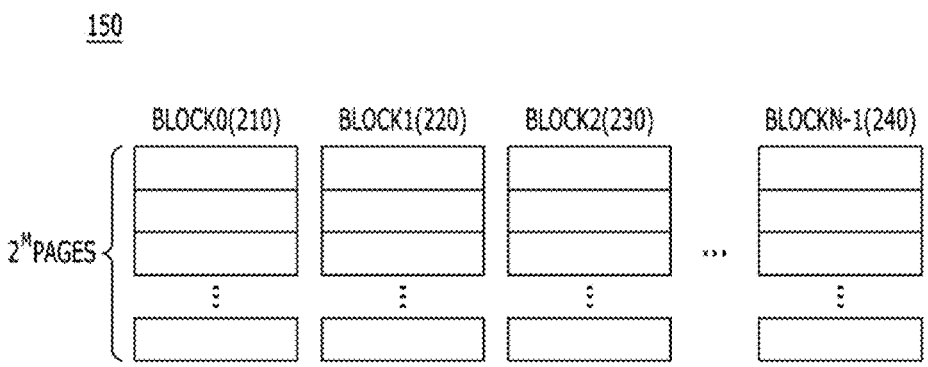
FIG. 2 is a diagram illustrating a memory device in the memory system shown in FIG. 1.

FIG. 2 is a diagram illustrating the memory device 150 in the memory system 110 shown in FIG. 1.

Referring to FIG. 2, the memory device 150 includes a plurality of memory blocks, for example, a zeroth block (BLOCK0) 210, a first block (BLOCK1) 220, a second block (BLOCK2) 230 and an N-1$^{th}$ block (BLOCKN-1) 240. Each of the blocks 210, 220, 230 and 240 includes a plurality of pages, for example, $2^M$ number of pages ($2^M$PAGES). While it is described for the sake of convenience in explanation that each of the plurality of memory blocks includes $2^M$ number of pages, it is to be noted that each of the plurality of memory blocks may include M number of pages. Each of the pages includes a plurality of memory cells to which a plurality of word lines (WL) are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block includes a plurality of pages which are implemented with memory cells each capable of storing 1-bit data, and may have high data calculation performance and superior durability. The MLC memory block includes a plurality of pages which are implemented with memory cells each capable of storing multi-bit data, for example, two or more-bit data, and may have a data storage space larger than the SLC memory block, that is, may be highly integrated. An MLC memory block including a plurality of pages which are implemented with memory cells that are each capable of storing 3-bit data may be defined as a triple level cell (TLC) memory block.

Each of the memory blocks 210, 220, 230 and 240 stores the data provided from the host device 102 of FIG. 1 during a write operation, and provides stored data to the host 102 during a read operation.

Figure 3:
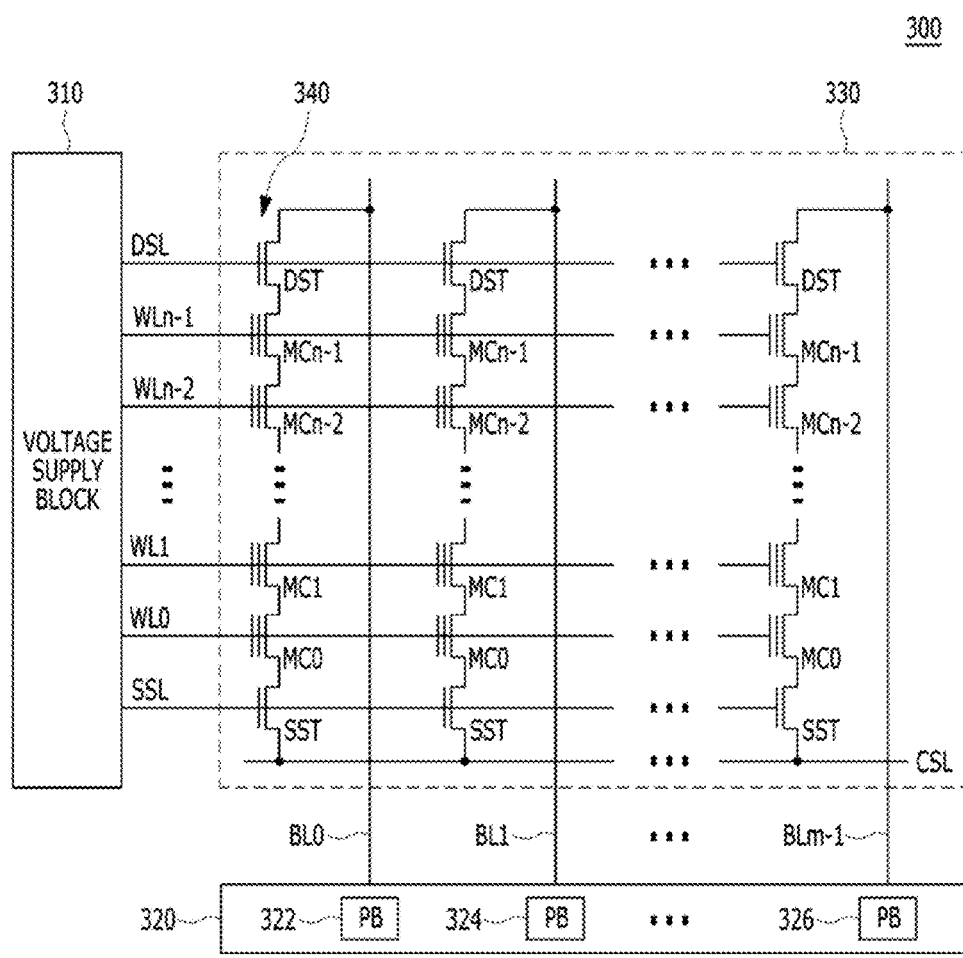
FIG. 3 is a circuit diagram illustrating a memory block in a memory device in accordance with an embodiment.

FIG. 3 is a circuit diagram illustrating a memory block in a memory device in accordance with an embodiment of the present invention.

Referring to FIG. 3, the memory block 330 of the memory device 300 may include a plurality of cell strings 340 which are electrically coupled to bit lines BL0 to BLm-1 respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, the memory block 330 which is configured by NAND flash memory cells, it is to be noted that the memory block 330 of the memory device 300 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 300 may provide word line voltages, for example, a program voltage a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 300 is controlled by the control circuit, and may serve as a sense amplifier or a write driver according to an operation mode. For example, during a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown) during the program operation, and may drive the bit lines according to the inputted data. To this end, the read/write circuit 320 may include a plurality of page buffers 322, 324 and 325 respectively corresponding to columns (or bit lines) or pairs of columns (or pairs of bit lines), and a plurality of latches (not shown) may be included in each of the page buffers 322, 324 and 326.

Hereinbelow, detailed descriptions will be made with reference to FIGS. 4 to 11, for the memory device 150 in the memory system in accordance with an embodiment, when the memory device is implemented with a three-dimensional (D) nonvolatile memory device.

Figure 4:
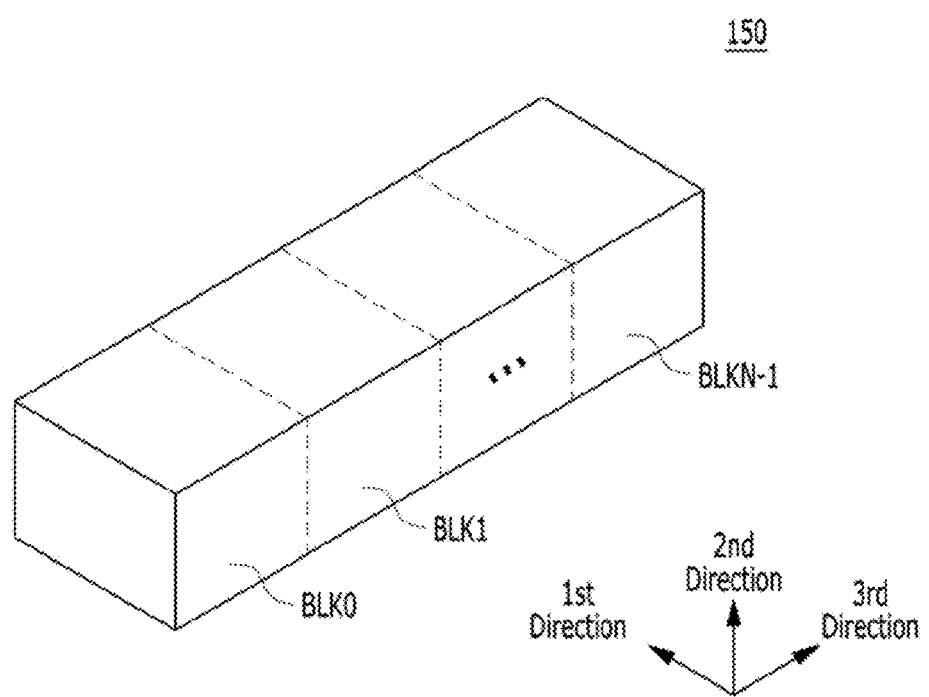
FIGS. 4 to 11 are diagrams schematically illustrating a memory device in a memory system in accordance with an embodiment.

FIG. 4 is a block diagram illustrating the memory block of the memory device 150 shown in FIG. 2.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. For example, the respective memory blocks BLK0 to BLKN−1 may include structures which extend in first to third directions, for example, an x-axis direction, a y-axis direction and a z-axis direction.

The respective memory blocks BLK0 to BLKN−1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN−1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
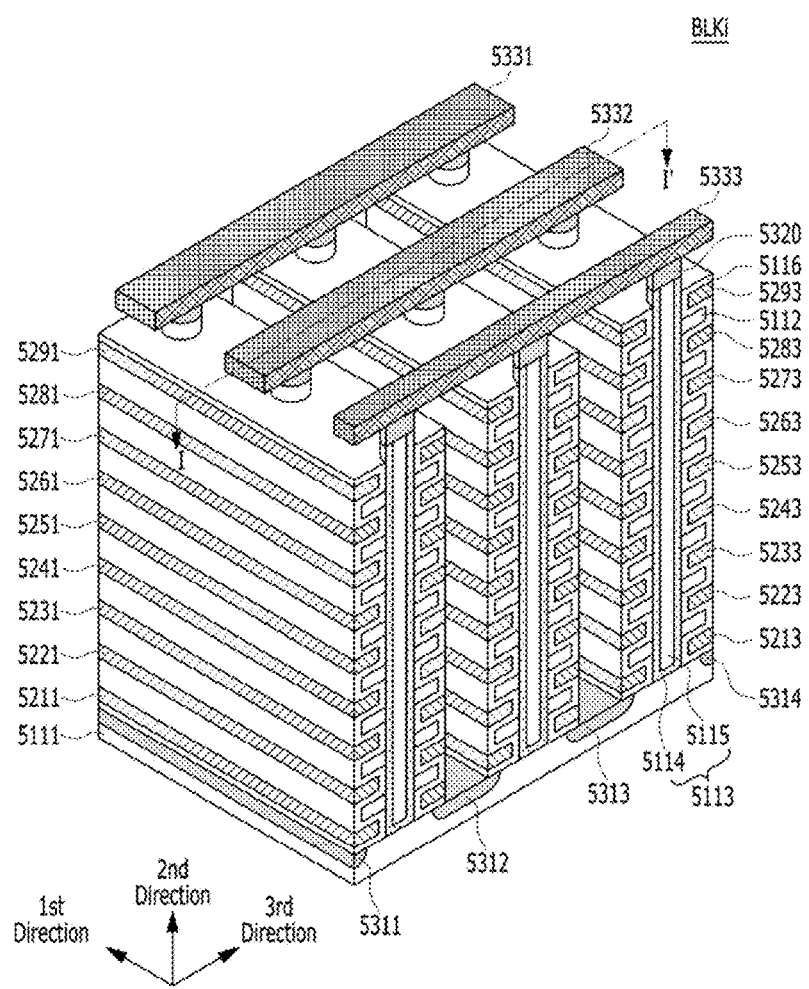
Figure 6:
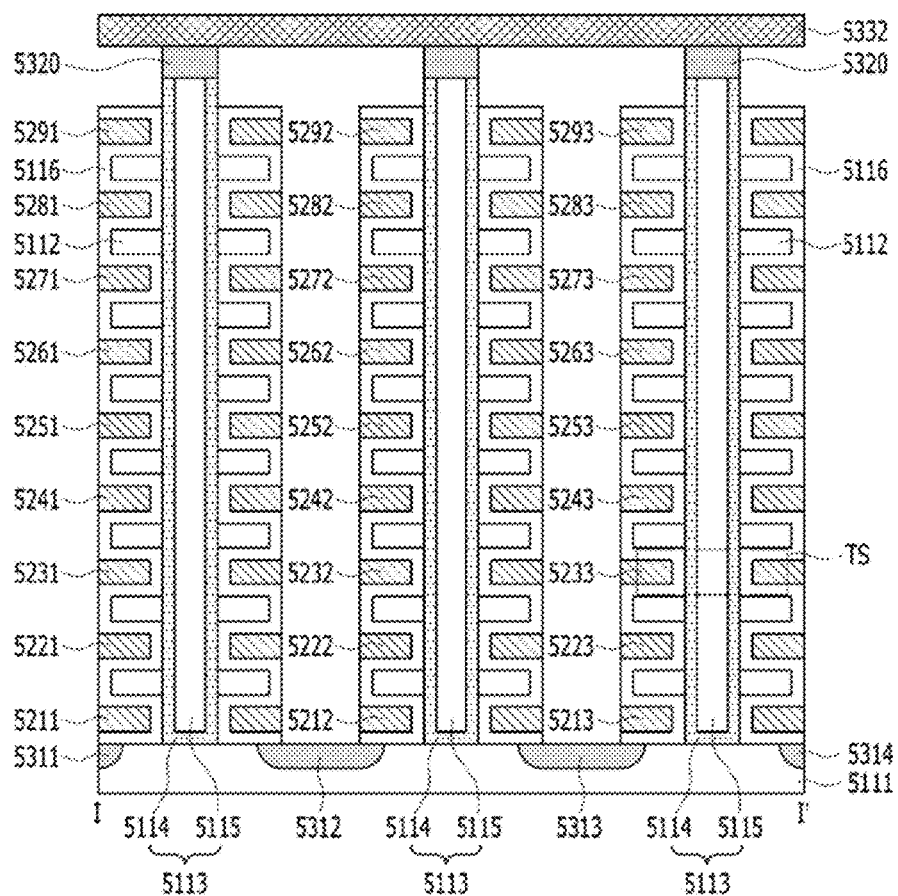

FIG. 5 is a perspective view of a certain memory block of the plural memory blocks BLK0 to BLKN−1 shown in FIG. 4. FIG. 6 is a cross-sectional view taken along a line I-I' of the memory block BLKi shown in FIG. 5.

Referring to FIGS. 5 and 6, the certain memory block BLKi among the plurality of memory blocks of the memory device 150 may include a structure which extends in the first to third directions.

A substrate 5111 may be provided. The substrate 5111 may include a silicon material doped with a first type impurity. For example, the substrate 5111 may include a silicon material doped with a p-type impurity or may be a p-type well, for example, a pocket p-well, and include an n-type well which surrounds the p-type well. While it is assumed in the embodiment for the sake of convenience in explanation that the substrate 5111 is p-type silicon, it is to be noted that the substrate 5111 is not limited to being p-type silicon.

A plurality of doping regions 5311 to 5314 which extend in the first direction may be provided over the substrate 5111. For example, the plurality of doping regions 5311 to 5314 may contain a second type of impurity that is different from the substrate 5111. For example, the plurality of doping regions 5311 to 5314 may be doped with an n-type impurity. While it is assumed in the embodiment for the sake of convenience in explanation that first to fourth doping regions 5311 to 5314 are n-type, it is to be noted that the first to fourth doping regions 5311 to 5314 are not limited to the n-type.

In the region over the substrate 5111 between the first and second doping regions 5311 and 5312, a plurality of dielectric materials 5112 which extend in the first direction may be sequentially provided in the second direction. For example, the plurality of dielectric materials 5112 and the substrate 5111 may be separated from one another by a predetermined distance in the second direction. For example, the plurality of dielectric materials 5112 may be separated from one another by a predetermined distance in the second direction. For example, the dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. For example, the plurality of pillars 5113 may respectively pass through the dielectric materials 5112 and may be electrically coupled with the substrate 5111. For example, each pillar 5113 may be configured by a plurality of materials. For example, a surface layer 5114 of each pillar 5113 may include a silicon material doped with the first type of impurity. For example, the surface layer 5114 of each pillar 5113 may include a silicon material doped with the same type of impurity as the substrate 5111. While it is assumed in the embodiment for the sake of convenience in explanation that the surface layer 5114 of each pillar 5113 includes p-type silicon, it is to be noted that the surface layer 5114 of each pillar 5113 is not limited to p-type silicon.

An inner layer 5115 of each pillar 5113 may be formed of a dielectric material. For example, the inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. For example, the thickness of the dielectric layer 5116 may be smaller than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. For example, the conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5115 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of a certain dielectric material of the dielectric materials 5112 and (ii) the dielectric layer 5116 disposed over the bottom surface of another dielectric material of the dielectric materials 5112, which is disposed over the certain dielectric material 5112. For example, the plurality of conductive materials 5221 to 5281 which extend in the first direction may be provided between the dielectric materials 5112. The conductive material 5291 which extends in the first direction may be provided over the uppermost dielectric material 5112. For example, the conductive materials 5211 to 5291 which extend in the first direction may be a metallic material. For example, the conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as the structures between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. For example, the drains 5320 may be silicon materials doped with second type impurities. For example, the drains 5320 may be silicon materials doped with n-type impurities. While it is assumed for the sake of convenience that the drains 5320 include n-type silicon, it is to be noted that the drains 5320 are not limited to n-type silicon. For example, the width of each drain 5320 may be larger than the width of each corresponding pillar 5113. For example, each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. For example, the drains 5320 and the conductive materials 5331 to 5333 which extend in the third direction may be electrically coupled with each other through contact plugs. For example, the conductive materials 5331 to 5333 which extend in the third direction may be a metallic material. For example, the conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. For example, the respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
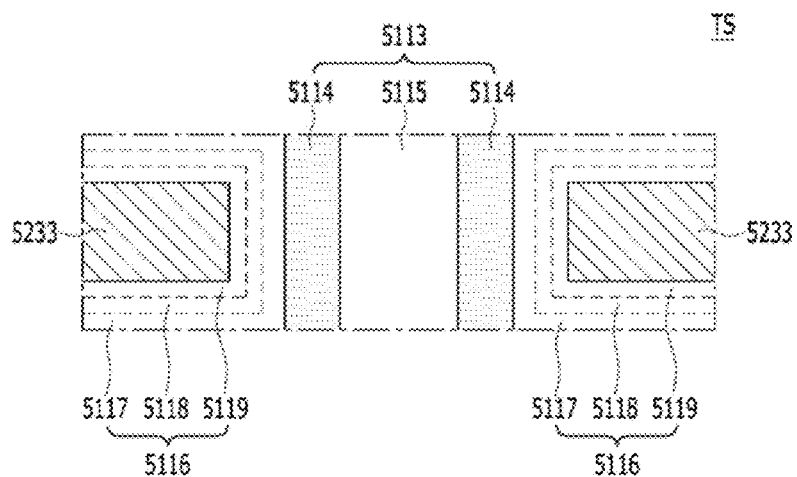

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. For example, the second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. For example, the third sub dielectric layer 5119 adjacent to the conductive material 5233 which extends in the first direction may be formed as a single layer or multiple layers. The third sub dielectric layer 5119 may be a high-k dielectric layer such as an aluminum oxide layer a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience in explanation, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a source select, transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, for example, at least one source select line SSL and at least one ground select line GSL.

The conductive materials 5331 to 5333 which extend in the third direction may be electrically coupled to one end of the NAND strings NS. For example, the conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi includes a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to the fact that 3 NAND strings NS are electrically coupled to one bit line BL. For example, in the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction it is to be noted that the embodiment is not limited to the fact that 3 NAND strings NS are electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
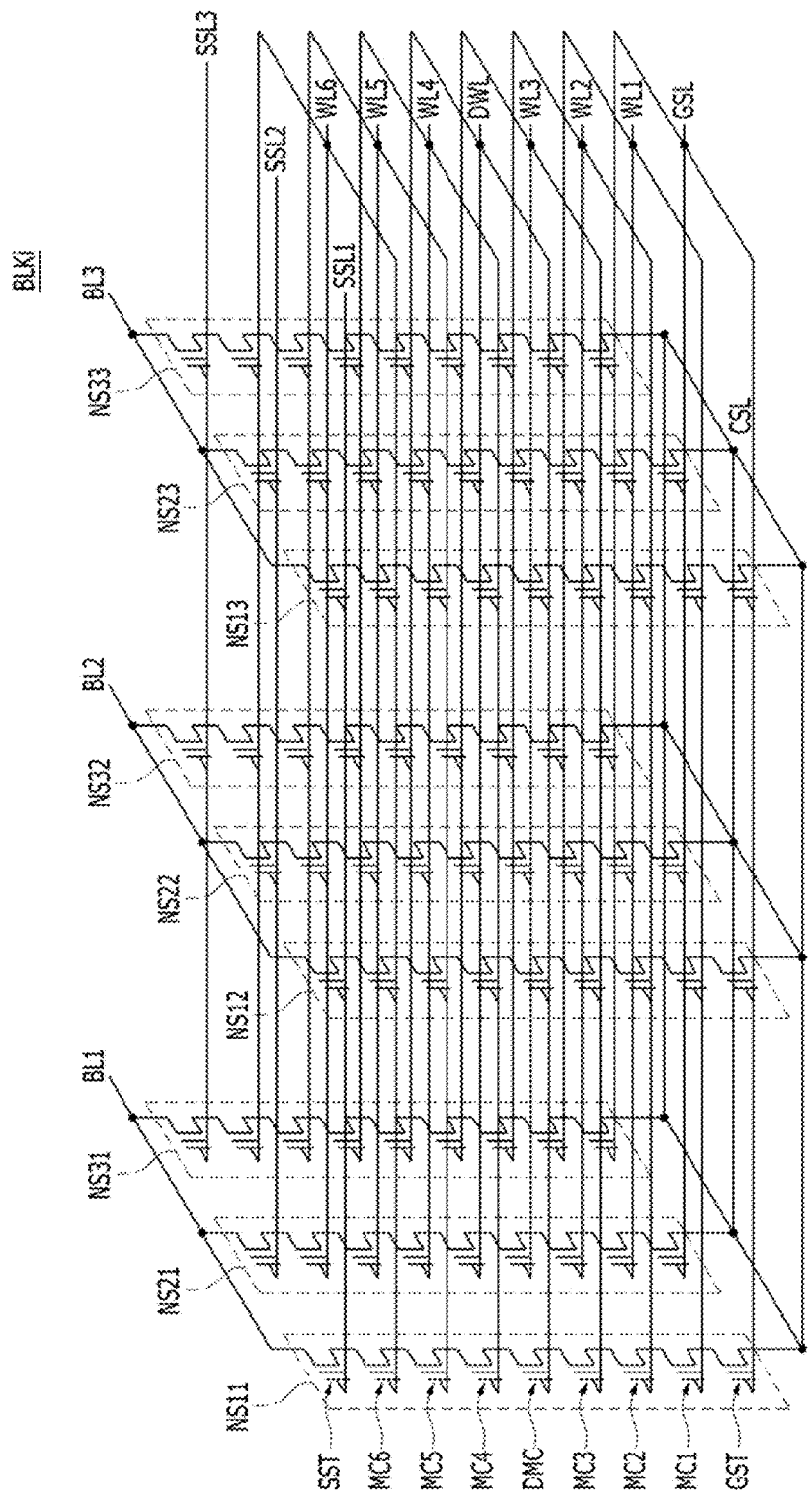

FIG. 8 is an equivalent circuit diagram illustrating the memory block BLKi having a first structure described with reference to FIGS. 5 to 7.

Referring to FIG. 8, in the certain block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In the embodiment, for the sake of convenience in explanation, it will be described as an example that NAND strings NS may be defined by the unit of row and column and NAND strings NS which are electrically coupled in common to one bit line may form one column. For example, the NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. For example, the NAND strings NS11 to NS13 which are electrically coupled to a first source select line SSL may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. For example, in each NAND string NS, the height of a memory cell MC1 adjacent to the ground select transistor GST is a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST is 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled in common with one another. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled with one another.

For example, the word lines WL or the dummy word lines DWL located at the same level or height or layer may be electrically coupled in common with one another at layers where the conductive materials 5211 to 5291, 5212 to 5292 and 5213 to 5293 which extend in the first direction are provided. For example, the conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled in common with one another. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled in common to the ground select line GSL.

The common source line CSL may be electrically coupled in common to the NAND strings NS. For example, over the active regions over the substrate 5111, the first to fourth doping regions 5311 to 5314 may be electrically coupled with one another. For example, the first to fourth doping regions 5311 to 5314 may be electrically coupled to an upper layer through contacts and, at the upper layer, the first to fourth doping regions 5311 to 5314 may be electrically coupled in common with one another.

Namely, as shown in FIG. 8, the word lines WL of the same height or level may be electrically coupled in common with one another. Accordingly, when a certain word line WL at a specific height is selected, all NAND strings NS which are electrically coupled to the certain word line WL may be selected. The NAND strings NS in different rows may be electrically coupled to different source select lines SSL. Accordingly, among the NAND strings NS electrically coupled to the same word line WL by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC is provided between a third memory cell MC3 and a fourth memory cell MC4 in each NAND string NS. That is first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST, may be referred to as a lower memory cell group, and memory cells, for example, MC4 to MC6, adjacent to the source select transistor SST, may be referred to as an upper memory cell group.

Hereinbelow, detailed descriptions will be made with reference to FIGS. 9 to 11 for when the memory device in the memory system in accordance with the embodiment is implemented with a three-dimensional (3D) nonvolatile memory device of a structure different from the first structure.

Figure 9:
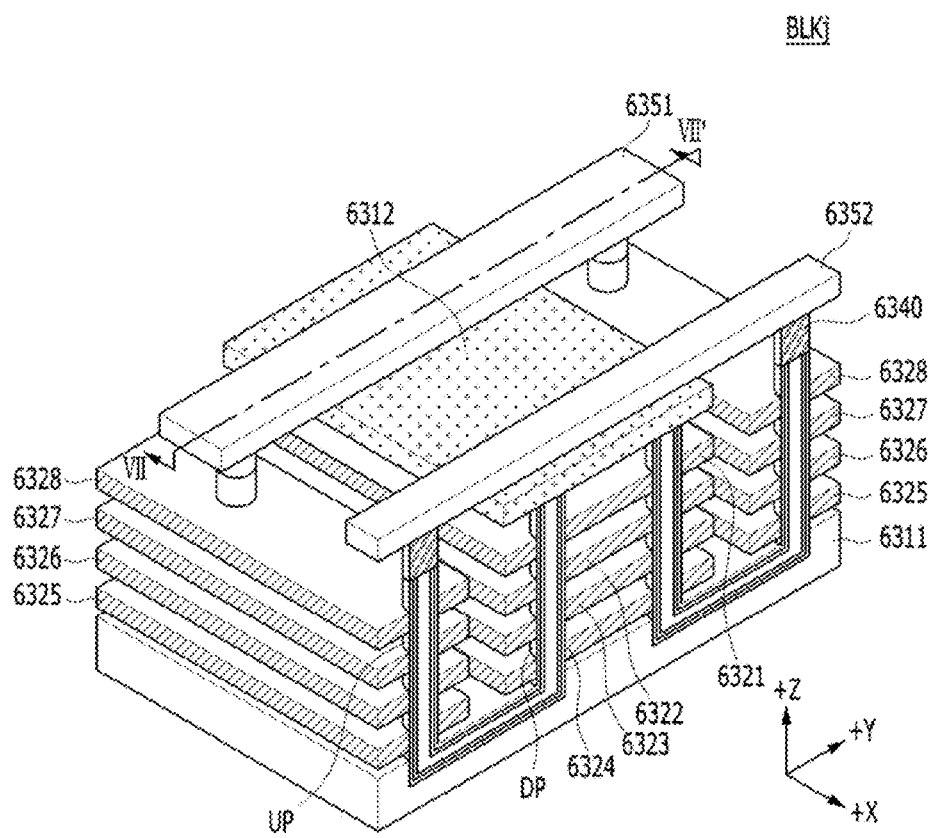
Figure 10:
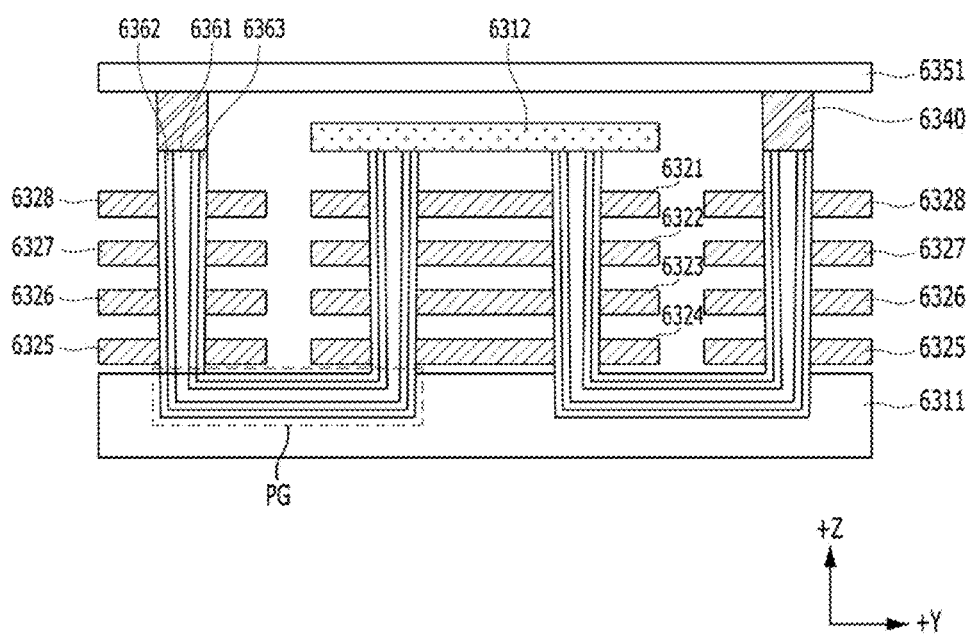

FIG. 9 is a perspective view schematically illustrating structures for when the memory device in accordance with the embodiment is implemented with a three-dimensional (3D) nonvolatile memory device of a second structure that is different from the first structure described above with reference to FIGS. 5 to 8 and showing a certain memory block BLKj having the second structure in the plurality of memory blocks of FIG. 4, and FIG. 10 is a cross-sectional view illustrating the certain memory block BLKj taken along the line VII-VII' of FIG. 9.

Referring to FIGS. 9 and 10, the certain memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience in explanation that the substrate 6311 is p-type silicon, it is to be noted that the substrate 6311 is not limited to p-type silicon.

First to fourth conductive materials 5321 to 6324 which extend in the x-axis direction and the y-axis direction are provided over the substrate 6311. The first to fourth conductive materials 6321 to 6324 are to be separated by a predetermined distance in the z-axis direction.

Fifth to eighth conductive materials 6325 to 6328 which extend in the x-axis direction and the y-axis direction are provided over the substrate 6311. The fifth to eighth conductive materials 6325 to 6328 are provided to be separated by the predetermined distance in the z-axis direction. The fifth to eighth conductive materials 6325 to 6328 are provided to be separated from the first to fourth conductive materials 6321 to 6324 in the y-axis direction.

A plurality of lower pillars DP which pass through the first to fourth conductive materials 6321 to 6324 are provided. Each lower pillar DP extends in the z-axis direction. Also, a plurality of upper pillars UP which pass through the fifth to eighth conductive materials 6325 to 6328 are provided. Each upper pillar UP extends in the z-axis direction.

Each of the lower pillars DP and the upper pillars UP includes an internal material 6361, an intermediate layer 6362, and a surface layer 6363. The intermediate layer 6362 serves as a channel of the cell transistor. The surface layer 6363 includes a blocking dielectric layer, a charge storing layer and a tunneling dielectric layer.

The lower pillar DP and the upper pillar UP are electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction is provided over the lower pillars DP. For example, the doping material 6312 of the second type may include an n-type silicon material. The doping material 6312 of the second type serves as a common source line CSL.

Drains 6340 are provided over the upper pillars UP. For example, the drains 6340 may include an n-type silicon material. First and second upper conductive materials 6351 and 6352 which extend in the y-axis direction are provided over the drains 6340.

The first and second upper conductive materials 6351 and 6352 are separated in the x-axis direction. For example, the first and second upper conductive materials 6351 and 6352 may be formed of a metal. For instance, the first and second upper conductive materials 6351 and 6352 and the drains 6340 may be electrically coupled with each other through contact plugs. The first and second upper conductive materials 6351 and 6352 respectively serve as first and second bit lines BL1 and BL2.

The first conductive material 6321 serves as a source select line SSL, the second conductive material 6322 serves as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 serves as a second dummy word line DWL2, and the eighth conductive material 6328 serves as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string are electrically coupled through the pipe gate PG. One end of the lower string is electrically coupled to the doping material 6312 of the second type which serves as the common source line CSL. One end of the upper string is electrically coupled to a corresponding bit line through the drain 6340. One lower string and one upper string form one cell string which is electrically coupled between the doping material 6312 of the second type, serving as the common source line CSL, and a corresponding one of the upper conductive material layers 6351 and 6352, serving as the bit line BL.

That is, the lower string includes a source select transistor SST, the first dummy memory cell DMC1, and the first and second main memory cells MMC1 and MMC2. The upper string includes the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
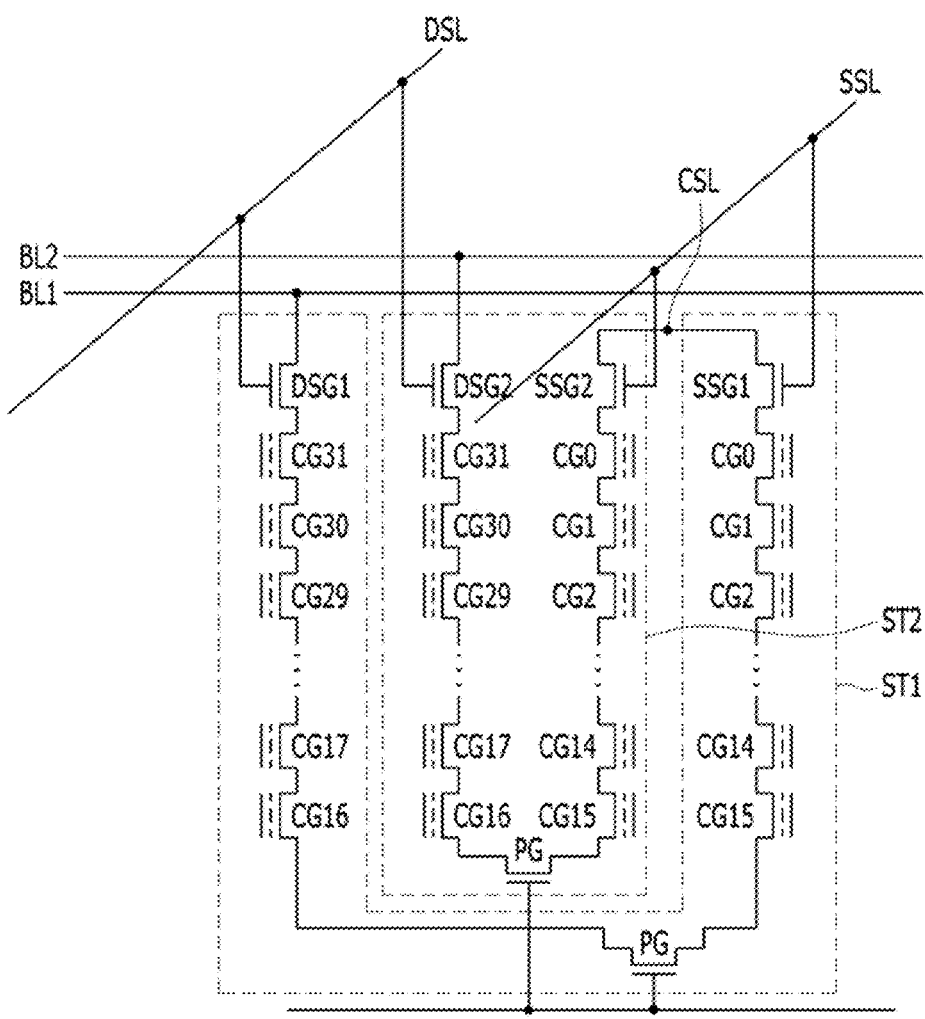

FIG. 11 is a circuit diagram illustrating the equivalent circuit of the memory block BLKj having the second structure as described above with reference to FIGS. 9 and 10. For the sake of convenience in explanation, only a first string and a second string, which form a pair in the certain memory block BLKj realized in the second structure, are shown.

Referring to FIG. 11, in the certain memory block BLKj having the second structure, among the plurality of blocks of the memory device 150, as described above with reference to FIGS. 9 and 10, cell strings, each of which is implemented with one upper string and one lower string are electrically coupled through the pipe gate PG, may be provided in such a way as to define a plurality of pairs.

Namely, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 are electrically coupled to the same drain select line DSL and the same source select line SSL. The first string ST1 is electrically coupled to a first bit line BL1, and the second string ST2 is electrically coupled to a second bit line BL2.

While it is described in FIG. 11 for the sake of convenience in explanation that the first string ST1 and the second string ST2 are electrically coupled to the same drain select line DSL and the same source select line SSL, it may be envisaged that the first string ST1 and the second string ST2 are electrically coupled to the same source select line SSL and the same bit line BL, the first string ST1 is electrically coupled to a first drain select line DSL1 and the second string ST2 is electrically coupled a second drain select line DSL2, or it may be envisaged that the first string ST1 and the second string ST2 are electrically coupled to the same drain select line DSL and the same bit line BL, the first string ST1 is electrically coupled to a first source select line SSL1 and the second string ST2 is electrically coupled a second source select line SSL2. Hereinbelow, detailed descriptions will be made with reference to FIGS. 12 to 14, for data processing, that is, read and write operations, with respect to a memory device in a memory system in accordance with an embodiment.

Figure 13:
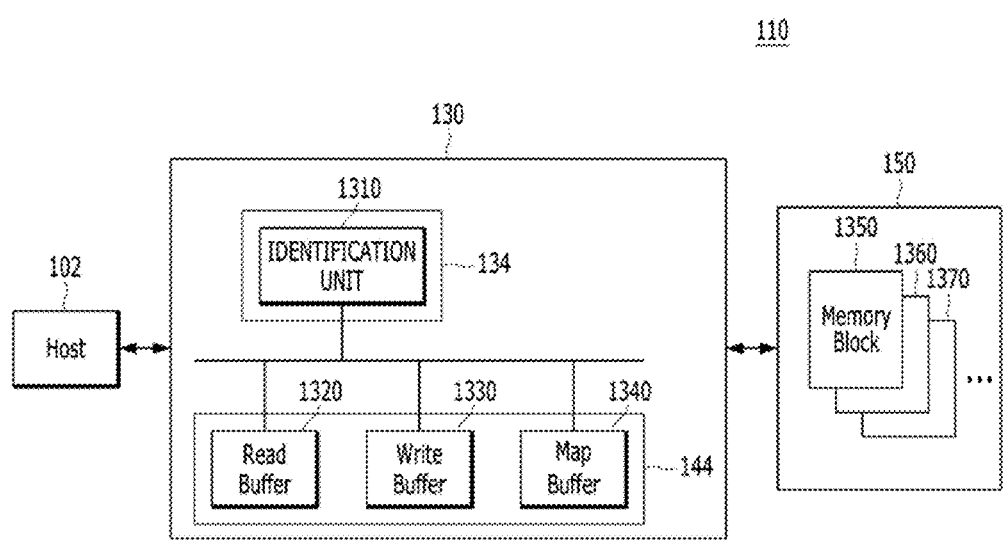

FIGS. 12 and 13 are diagrams explaining a data processing operation with respect to a memory device in a memory system in accordance with an embodiment. In the embodiment, for the sake of convenience in explanation, read and write operations in the memory system 110 shown in FIG. 1, for reading and writing data in a plurality of pages included in a plurality of SLC memory blocks and a plurality of MLC memory blocks among a plurality of memory blocks of the memory device 150 shown in FIG. 2, will be described as an example.

Referring to FIGS. 12 and 13, the memory system 110 includes the memory device 150 which includes a plurality of memory blocks, and the controller 130 which controls the read and write operations of the memory device 150.

In detail, referring to FIG. 12, the memory device 150 includes a plurality of memory blocks, for example, zeroth blocks (Block0) 1210 and 1250, first blocks (Block1) 1220 and 1260, second blocks (Block2) 1230 and 1270, and third blocks (Block3) 1240 and 1280. Each of the plurality of memory blocks 1210 to 1280 includes a plurality of pages. For the sake of convenience in explanation, it will be described as an example that, in the plurality of memory blocks 1210 to 1280, the zeroth blocks 1210 and 1250, the first blocks 1220 and 1260 and the second blocks 1230 and 1270 are MLC memory blocks and the third blocks 1240 and 1280 are SLC memory blocks and, also, it will be described as an example that, in the plurality of memory blocks 1210, 1220, 1230 and 1240, data are written and stored in the pages which are included in the zeroth block 1210, the first block 1220 and the second block 1230 as the MLC memory blocks.

That s, the write data received from a host are stored in the pages which are included in the zeroth block 1210, the first block 1220 and the second block 1230 as the MLC memory blocks among the plurality of memory blocks 1210, 1220, 1230 and 1240 of the memory device 150, and the data stored in the pages of the zeroth block 1210, the first block 1220 and the second block 1230 are provided to the host during a read operation responsive to a read command, that is, the read request, received from the host.

When the data stored in a random page of a block is read during the read operation in response to the read command received from the host and is provided to the host, the data stored in the random page of the block is determined as hot data or cold data in response to a read count or a read frequency by the read operation.

For example, read data corresponding to the read command received from the host, that is, the data stored in the random page of the block, may be determined as hot data or cold data when the read count or the read frequency of the read data is larger or smaller than other read data, for example, the data stored in another random page of the block or the data stored in a random page of another block. Further, the read data may be determined as hot data or cold data when the read count or the read frequency of the read data is larger or smaller than a threshold value.

The data stored in the random page of the block may be determined as hot data or cold data according to priorities of the data stored in the pages of the plurality of blocks. The priorities of the data stored in the pages of the plurality of blocks may be determined by the importance of the data, the size of the data, processing times, processing speed, when reading/writing the data, that is, the latencies of the data, and so forth. According to the priorities, the data stored in the pages of the respective blocks may be determined to be hot data or cold data. For example, data of which priority has a high level may be determined as hot data, and data of which priority has a low level may be determined as cold data.

Moreover, information for determining the data stored in the pages of the respective blocks as hot data or cold data, for example, read counts, read frequencies, and information for determining priorities, such as the importance of data, the sizes of data and the latencies of the data, are inputted in the form of a context, to the command received from the host. The data stored in the pages of the respective blocks may be determined as hot data or cold data based on the information in the form of a context. In the command received from the host, the priority information of data corresponding to a read command may be included in the form of a context, or information indicating that data corresponding to a read command is hot data or cold data may be included in the form of a context.

Read data corresponding to the read command received from the host may be identified through a hot data detection algorithm or a hot page detection algorithm.

As the data stored in the pages of the respective blocks are determined as hot data or cold data, the data stored in the pages included in the zeroth block 1210, the first block 1220 and the second block 1230 as the MLC memory blocks among the plurality of memory blocks 1210, 1220, 1230 and 1240 of the memory device 150 are determined as hot data or cold data.

Among the pages included in the zeroth block 1210, the first block 1220 and the second block 1230 of the memory device 150, the data stored in a $K^{th}$ page 1214 of the zeroth block 1210, that is, $K^{th}$ data, the data stored in a first page 1224 of the first block 1220, that is, first data, and the data stored in a zeroth page 1232 of the second block 1230, that is, zeroth data, are assumed to hot data, and the data stored in the remaining pages of the zeroth block 1210, the first block 1220 and the second block 1230 are assumed to be cold data.

For the $K^{th}$ data, the first data and the zeroth data as hot data in the zeroth block 1210, the first block 1220 and the second block 1230 as the MLC memory blocks of the memory device 150, the read command from the host is received with frequencies higher than the remaining pages of the zeroth block 1210, the first block 1220 and the second block 1230 that is the read operations are performed with larger counts. Due to this fact, read disturbance, that is, a page failure may occur in the data stored in pages adjacent to the pages in which the $K^{th}$ data the first data and the zeroth data as hot data are stored. That is, the read disturbance may occur in a $(K-1)^{th}$ page 1212 and a $(K+1)^{th}$ page 1216 of the zeroth block 1210 which are adjacent to the $K^{th}$ page 1214 of the zeroth block 1210, a zeroth page 1222 and a second page 1226 of the first block 1220 which are adjacent to the first page 1224 of the first block 1220, and a first page 1234 of the second block 1230 which is adjacent to the zeroth page 1232 of the second block 1230.

In other words, the read disturbance may occur in the pages 1212, 1216, 1222, 1226 and 1234 which are adjacent to the pages 1214, 1224 and 1232 where the $K^{th}$ data, the first data and the zeroth data as the hot data are stored, as the read operations are performed on the hot data with larger counts.

Therefore, the data stored in the adjacent pages 1212, 1216, 1222, 1226 and 1234 may be failed data due to an increased occurrence of errors.

In the memory system 110 in accordance with the embodiment, the hot data, i.e., the $K^{th}$ data, the first data and the zeroth data stored in the $K^{th}$ page 1214 of the zeroth block 1210, the first page 1224 of the first block 1220 and the zeroth page 1232 of the second block 1230, are written in the pages which are included in the third block 1280 as the SLC memory block. In other words, the hot data, i.e., the $K^{th}$ data, the first data and the zeroth data, are moved to the SLC memory block and are stored in the pages of the SLC memory block.

In detail, when data corresponding to the read command received from the host are the hot data, i.e., the $K^{th}$ data, the first data and the zeroth data stored in the $K^{th}$ page 1214 of the zeroth block 1210, the first page 1224 of the first block 1220 and the zeroth page 1232 of the second block 1230, the controller 130 of the memory system 110 may read and store the hot data in the memory 144 thereof and, then, store the hot data stored in the memory 144 in the third block 1280 as the SLC memory block. The hot data, i.e., the $K^{th}$ data, the first data and the zeroth data stored in the $K^{th}$ page 1214 of the zeroth block 1210, the first page 1224 of the first block 1220 and the zeroth page 1232 of the second block 1230, may be stored in a read buffer and a write buffer which are included in the memory 144 of the controller 130. The hot data, i.e., the $K^{th}$ data, the first data and the zeroth data, stored in the read buffer of the memory 144 may be provided to the host, and the hot data, i.e., the $K^{th}$ data, the first data and the zeroth data, stored in the write buffer of the memory 144 may be stored in the third block 1280 as the SLC memory block.

For example, in the memory system 110, the $K^{th}$ data stored in the $K^{th}$ page 1214 of the zeroth block 1210 may be written and stored in a zeroth page 1282 of the third block 1280, the first data stored in the first page 1224 of the first block 1220 may be written and stored in a first page 1284 of the third block 1280, and the zeroth data stored in the zeroth page 1232 of the second block 1230 may be written and stored in a second page 1286 of the third block 1280.

In this way, in the memory system 110, as the hot data are stored in the pages 1282, 1284 and 1286 of the third block 1280 as the SLC memory block of the memory device 150, only cold data are stored in the zeroth block 1250, the first block 1260 and the second block 1270 as the MLC memory blocks of the memory device 150.

Thus, in the memory system 110, because the hot data are stored in the pages of the third block 1280 as the SLC memory block which has excellent data calculation performance and superior durability, many read operations may be quickly performed on the hot data. Even though many read operations are performed, since the possibility of an error to occur in the hot data stored in the pages of the third block 1280 as the SLC memory block is low, the read operations on the hot data may be stably performed. Moreover, in response to the many read operations on the hot data, since error correcting operations are performed on the pages of the third block 1280 as the SLC memory block, error detection for the pages of the third block 1280 as the SLC memory block may be easily performed. As a consequence, by normally performing the error correcting operations on the pages of the third block 1280, the data stored in the pages of the third block 1280 may be stably retained.

In addition, in the memory system 110, since only cold data are stored in the pages of the zeroth block 1250, the first block 1260 and the second block 1270 as the MLC memory blocks, occurrence of read disturbance due to the read operations on the hot data may be prevented, and thus, the data stored in the pages of the zeroth block 1250, the first block 1260 and the second block 1270 as the MLC memory blocks may be stably retained. Hereinbelow, detailed descriptions will be made with reference to FIG. 13, for a memory system which performs a data processing operation with respect to a memory device in accordance with the embodiment.

Referring to FIG. 13, the memory system 110 includes the memory device 150 which includes a plurality of memory blocks 1350, 1360 and 1370, and the controller 130 which controls read and write operations of the memory device 150 in response to the commands received from the host 102.

In detail, the memory device 150 includes the plurality of memory blocks 1350, 1360 and 1370 which are divided into SLC memory blocks and MLC memory blocks.

The controller 130 performs the read operation for reading data from the memory device 150, in response to the command received from the host 102, for example, a read command, and provides read data to the host 102. The controller 130 includes the processor 134 which performs such a read operation for reading data, and the memory 144 which stores data corresponding to the read operation.

In particular, the processor 134 of the controller 130 includes an identification unit 1310 which identifies whether data corresponding to the read command received from the host 102 is hot data. While it is described as an example in the embodiment, for the sake of convenience in explanation, that the identification unit 1310 is included in the processor 134, it is to be noted that the identification unit 130 may be included in the controller 130 outside the processor 134. Whether data corresponding to the read command received from the host 102 is hot data may be determined in response to a read count or a read frequency, or may be determined by priority according to the importance of the data, the size of the data and the latency of the data.

The memory 144 of the controller 130 includes a read buffer 1320, a write buffer 1330, and a map buffer 1340.

In order to read data corresponding to the read command received from the host 102, from the memory device 150, and provide the read data to the host 102, the read buffer 1320 of the memory 144 reads and stores the data from the memory device 150.

For example, as described above with reference to FIG. 12, when data corresponding to the read command received from the host 102 is the hot data stored in the page of the MLC memory block of the memory device 150, in order to store the hot data from the page of the MLC memory block to the page of the SLC memory block of the memory device 150, the write buffer 1330 of the memory 144 reads and stores the hot data from the page of the MLC memory block. The hot data stored in the write buffer 1330 is written and stored in the page of the SLC memory block of the memory device 150.

The map buffer 1340 of the memory 144 stores map information on data corresponding to the read command received from the host 102. In particular, as described above with reference to FIG. 12, when hot data stored in the page of the MLC memory block is to be written and stored in the page of the SLC memory block, the map buffer 1340 of the memory 144 updates and stores the map information on the hot data stored in the page of the SLC memory block, and the map information stored in the map buffer 1340 may be stored in the memory block of the memory device 150. Hereinbelow, operations for processing data in the memory system in accordance with the embodiment will be described in detail with reference to FIG. 14.

Figure 14:
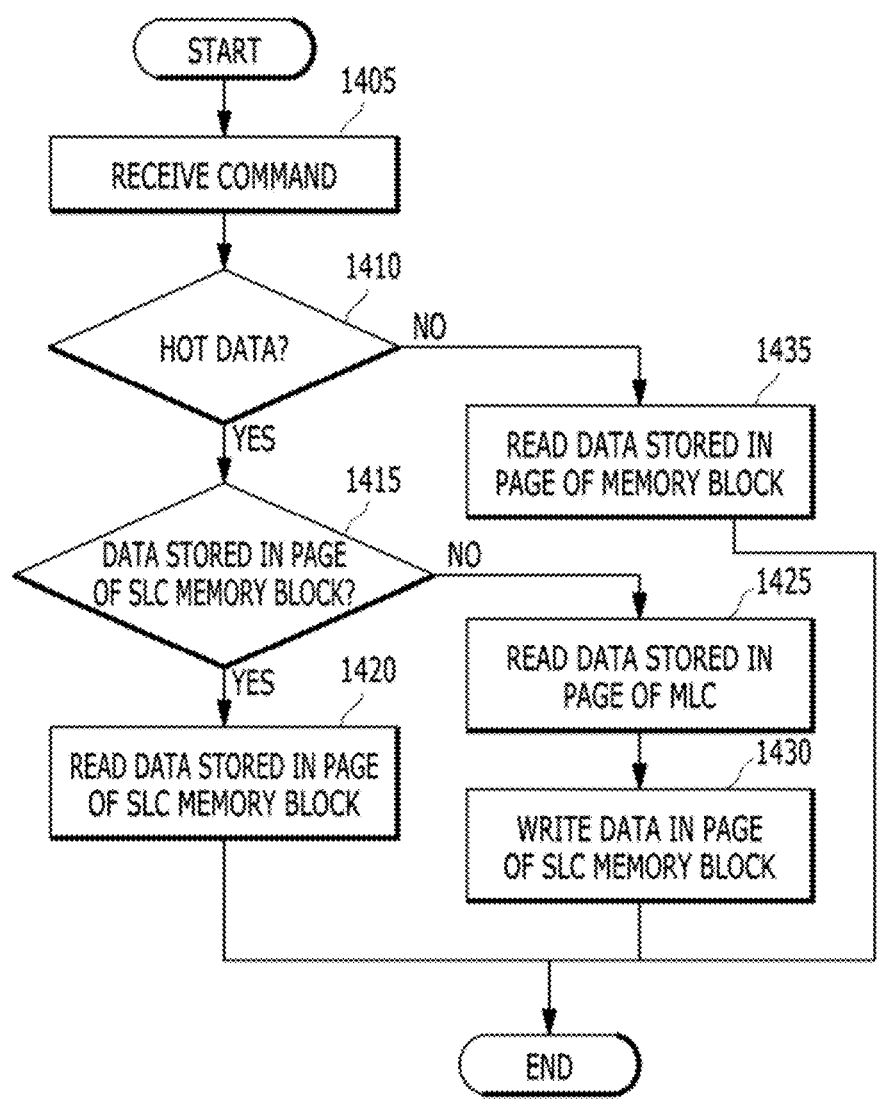
FIG. 14 is a flow chart explaining an operation for processing data in a memory system in accordance with an embodiment.

FIG. 14 is a flow chart explaining an operation for processing data in a memory system in accordance with an embodiment.

Referring to FIG. 14, at step 1405, the memory system receives a command, for example, a read command, from the host.

At step 1410, whether data corresponding to the read command received from the host is hot data is identified. Since detailed descriptions for hot data were made above, further descriptions thereof will be omitted herein. Namely, at the step 1410, whether data corresponding to the read command received from the host is hot data or cold data is identified.

When the data corresponding to the read command is the hot data at step 1410 (YES), it is checked that at step 1415, the map information on the data corresponding to the read command is stored in the map buffer, and it is determined whether the data corresponding to the read command is stored in the page of the SLC memory block of the memory device based on the map information. As described above, the map information may be stored in the map buffer and the memory block of the memory device. Based on the map information, whether the data corresponding to the read command is stored in the SLC memory block or the MLC memory block is checked.

When the hot data is stored in the SLC memory block at step 1415 (YES), the data stored in the page of the SLC memory block, that is, the hot data, is read at step 1420. Then, the hot data is stored in the read buffer and is provided to the host.

When it is determined that the hot data is stored in the MLC memory block at step 1415 (No), the data stored in the page of the MLC memory block, that is, the hot data, is read at step 1425. Then, the hot data is stored in the read buffer and is provided to the host, and is also stored in the write buffer.

Then, at step 1430, the hot data read from the page of the MLC memory block and stored in the write buffer is written and stored in the page of the SLC memory block. Since an operation for moving, that is, writing and storing the data from the page of the MLC memory block to the page of the SLC memory block, has been described above in detail with reference to FIG. 12, further descriptions thereof will be omitted herein.

When the data corresponding to the read command is cold data at step 1410 (NO), at step 1435, it is checked whether the map information on the data corresponding to the read command is stored in the map buffer, and after checking the page of the memory block in the memory device in which the data corresponding to the read command is stored based on the map information, the data stored in the page of the memory block, that is, the cold data, is read. Then, the cold data is stored in the read buffer and is provided to the host.

As is apparent from the above descriptions, the memory system and the method of operating the same according to the embodiments may quickly and stably process data from a memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device including memory blocks, each of the memory blocks including pages, each of the pages including memory cells that are electrically coupled to word lines, wherein the memory cells store data that is requested from a host; and a controller suitable for reading hot data corresponding to a read command received from the host, from pages included in different memory blocks, storing the hot data in a buffer, providing the hot data stored in the buffer to the host, and writing and storing the hot data that is stored in the buffer to pages included in a same memory block different from the memory blocks from which the hot data is read.

2. The memory system according to claim 1, wherein the hot data is identified in response to at least one of a read count, a read frequency and a priority of data that is requested from the host.

3. The memory system according to claim 2, wherein the priority is determined in response to at least one of an importance of data that is requested from the host, a size of data and a latency of data.

4. The memory system according to claim 3, wherein information on the priority is included in the read command received from the host.

5. The memory system according to claim 4, wherein information indicating that the first data is the hot data is included in the read command received from the host.

6. The memory system according to claim 1,
wherein the first memory block is a multi-level cell (MLC) memory block, and
wherein the second memory block is a single level cell (SLC) memory block.

7. The memory system according to claim 1, wherein, when a read command for the first data stored in the page of the second memory block is received from the host, the controller reads the first data from the page of the second memory block, stores the first data in the buffer, and provides the first data to the host.

8. The memory system according to claim 1, wherein the controller updates data storage information indicating that the first data is stored in the page of the first memory block, with information indicating that the first data is stored in the page of the second memory block.

9. A method for operating a memory system, comprising:
receiving a read command from a host;
checking data storage information on hot data corresponding to the read command, and reading the hot data from pages included in different memory blocks based on the data storage information;
storing the hot data in a buffer;
providing the hot data, which is stored in the buffer, to the host; and
writing and storing the hot data stored in the buffer, in pages included in a same memory block different from the memory blocks from which the hot data is read.

10. The method according to claim 9, wherein the hot data is identified in response to at least one of a read count, a read frequency, and a priority of data that is requested from the host.

11. The method according to claim 10, wherein the priority is determined in response to at least one of an importance of data that is requested from the host, a size of data and a latency of data.

12. The method according to claim 11, wherein information on the priority is included in the read command, in the form of a context.

13. The method according to claim 12, wherein information indicating that the first data is the hot data is included in the read command.

14. The method according to claim 9,
wherein the first memory block is a multi-level cell (MLC) memory block, and
wherein the second memory block is a single level cell (SLC) memory block.

15. The method according to claim 9, further comprising:
updating the data storage information indicating that the first data is stored in the page of the first memory block, with information indicating that the first data is stored in the page of the second memory block.

16. The method according to claim 15, further comprising:
receiving a read command for the first data stored in the page of the second memory block, from the host; and
reading the first data from the page of the second memory block, based on the updated data storage information.

* * * * *